(12) United States Patent
Warashina et al.

(10) Patent No.: US 7,226,219 B2
(45) Date of Patent: Jun. 5, 2007

(54) HIGH-FREQUENCY SIGNAL TRANSMITTING OPTICAL MODULE AND METHOD OF FABRICATING THE SAME

(75) Inventors: Yoshihisa Warashina, Hamamatsu (JP); Yasuji Hoshino, Hamamatsu (JP); Kei Tabata, Hamamatsu (JP); Shogo Iyama, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 108 days.

(21) Appl. No.: 10/984,748

(22) Filed: Nov. 10, 2004

(65) Prior Publication Data
US 2005/0100293 A1 May 12, 2005

Related U.S. Application Data

(60) Provisional application No. 60/526,986, filed on Dec. 5, 2003.

(30) Foreign Application Priority Data
Nov. 12, 2003 (JP) .......................... P2003-382540

(51) Int. Cl.
G02B 6/36 (2006.01)
H01L 27/15 (2006.01)
H01L 31/12 (2006.01)
H01L 33/00 (2006.01)
H01L 23/06 (2006.01)
H01L 21/00 (2006.01)

(52) U.S. Cl. .......................... 385/92; 385/94; 257/81; 257/684; 257/692; 438/29; 438/31

(58) Field of Classification Search ............. 385/92–94
See application file for complete search history.

(56) References Cited

U.S. PATENT DOCUMENTS

| 4,309,717 | A | 1/1982 | Cardinal ...................... 357/74 |
| 4,831,723 | A | 5/1989 | Kaufman ...................... 29/827 |
| 4,927,228 | A * | 5/1990 | Van De Pas .................. 385/90 |
| 6,074,102 | A * | 6/2000 | Oikawa ........................ 385/88 |
| 6,417,747 | B1 | 7/2002 | Dearden et al. ............ 333/247 |
| 6,595,699 | B1 * | 7/2003 | Nguyen et al. ............... 385/88 |
| 2001/0021054 | A1 | 9/2001 | Lee ............................. 359/163 |
| 2005/0093927 | A1 * | 5/2005 | Lassar et al. ................. 347/50 |

FOREIGN PATENT DOCUMENTS

| JP | 02-013811 | 1/1990 |
| JP | 04-035474 | 2/1992 |
| JP | 05-268535 | 10/1993 |
| JP | 2001-189515 | 7/2001 |
| JP | 2001-339057 | 12/2001 |
| JP | 2002-299645 | 10/2002 |
| JP | 2003-229624 | 8/2003 |

* cited by examiner

*Primary Examiner*—Brian Healy
*Assistant Examiner*—Charlie Peng
(74) *Attorney, Agent, or Firm*—Drinker Biddle & Reath LLP

(57) ABSTRACT

The present invention relates to a high-frequency signal transmitting optical module which can easily realize a high-frequency signal transmission by use of a semiconductor optical device to which a highly versatile metal can package has been applied. In the high-frequency signal transmitting optical module, after fixing, to a rear surface of a stem of the metal can package, fixing portions of the linear outer leads by laser welding, the end portions of the outer leads are bent. By this, the outer leads can be easily attached to the semiconductor optical device. On both sides of the respective lead pins of the semiconductor optical device, since the outer leads extending along these are attached to the rear surface of the stem, ground regions are continuously provided on both sides of the respective lead pins by the stem and respective outer leads, whereby TEM wave transmission lines are formed. Accordingly, high-frequency signals can be transmitted to the semiconductor optical device.

8 Claims, 11 Drawing Sheets

HIGH-FREQUENCY SIGNAL TRANSMITTING OPTICAL MODULE AND METHOD OF FABRICATING THE SAME

CROSS-REFERENCE TO RELATED APPLICATION

This application claims priority to Provisional Application Ser. No. 60/526,986 filed on Dec. 5, 2003, which is hereby incorporated by reference in its entirety.

BACKGROUND OF THE INVENTION

1. Field of the Invention

The present invention relates to a high-frequency signal transmitting optical device using an optical semiconductor device and a method of fabricating the same.

2. Related Background Art

A semiconductor optical device applied to a high-frequency signal transmitting optical module is generally constructed with a ceramic package or a plastic package (see Japanese Laid-Open Patent Application No. 2001-189515, for example.) The reason is that, when carrying out a high-frequency signal transmission, it is necessary to form TEM wave transmission lines such as coplanar lines and microstrip lines on a package itself of a semiconductor optical device.

SUMMARY OF THE INVENTION

The inventors have studied conventional optical modules in detail, and as a result, have found problems as follows.

Namely, in such an optical module as described above, the package structure of the semiconductor optical device is complicated since TEM wave transmission lines are formed, and a cost reduction is prevented, therein a problem has existed.

In order to overcome the above-mentioned problems, it is an object of the present invention to provide a high-frequency signal transmitting optical module which can easily realize a high-frequency signal transmission by use of a semiconductor optical device to which a highly versatile metal can package has been applied and a method of fabricating the same.

In order to achieve the above-described object, a high-frequency signal transmitting optical module according to the present invention comprises a semiconductor optical device, and outer leads. The semiconductor optical device has a semiconductor optical element, a metal can package accommodating the semiconductor optical element therein, and signal transmission pins protruding via through holes provided in a stem of the metal can package. The outer leads are attached to a rear surface of the stem and extend along the signal transmission pins on both sides the signal transmission pins.

In particular, the high-frequency signal transmitting optical module according to the present invention is characterized in such that each of said outer leads has a fixing portion provided by bending an end potion of each outer lead, and the fixing portion is fixed to the rear surface of the stem are provided by bending end portions on the stem side of each outer lead.

In this high-frequency signal transmitting optical module, the outer leads can be easily attached to the rear surface of the stem of the semiconductor optical device. This is made possible by, for example, fixing the fixing portions of outer leads to the rear surface of the stem by use of a solder, a conductive adhesive or the like in a condition where the outer leads have been bent or by fixing the fixing portions to the rear surface of the stem by laser welding or the like in a condition where the outer leads have not yet been bent and then bending the outer leads; As such, since the outer leads extending along the signal transmission pins on both sides of the signal transmission pins of the semiconductor optical device are attached to the rear surface, when the outer leads are connected to ground potential, ground regions are continuously provided on both sides of the lead pins by the stem and respective outer leads. Thereby, since TEM wave transmission lines are formed by the signal transmission pins, stem, and respective outer leads, it becomes possible to transmit a high-frequency signal to the semiconductor optical device. By the above, according to this high-frequency signal transmitting optical module, a high-frequency signal transmission can be easily realized by use of the semiconductor optical device to which the highly versatile metal can package has been applied.

It is preferable that the fixing portions are fixed to the rear surface of the stem by laser welding. If laser welding is used for a fixation between the fixing portions and stem, since heating of the fixing portions and stem can be made sufficient with local and short-time heating, harmful effects of heating exerted onto the semiconductor optical element, etc., of the semiconductor optical device can be prevented. Moreover, since the fixing force by laser welding is strong, in such a case as, for example, the fixing portions are fixed to the rear surface of the stem in a condition where the outer leads have not yet been bent and then the outer leads are bent, fixation by laser welding is particularly effective.

It is preferable that at least the fixing portions of the outer leads have a plate-like form. In such a case as, for example, the fixing portions are fixed to the rear surface of the stem in a condition where the outer leads have not yet been bent and then the outer leads are bent, if at least the fixing portions of the outer leads have a plate-like form, bending of the outer leads can be easily carried out. Moreover, since the fixing portions of the outer leads are to be made in surface contact with the rear surface of the stem, the outer leads can be, in a stable condition, securely attached to the rear surface of the stem.

Furthermore, it is preferable that, at the parts where the stem-side end portions of the outer leads are bent, weakened portions to ease bending are formed. Similar to the above, in such a case as, for example, the fixing portions are fixed to the rear surface of the stem in a condition where the outer leads have not yet been bent and then the outer leads are bent, when weaken portions to ease bending are formed at the parts where the stem-side end portions of the outer leads are bent, bending of the outer leads can be easily and accurately carried out.

In addition, a method of fabricating a high-frequency signal transmitting optical module according to the present invention, comprising the steps of: preparing a semiconductor optical device which houses a semiconductor optical element in a metal can package and makes signal transmission pins protrude from through holes formed in a stem of the metal can package; disposing, so that, of linear outer leads whose one-end portions are fixing portions, side surfaces of the fixing portions are brought into contact against predetermined positions of a rear surface of the stem, the outer leads on both sides of the signal transmission pins and fixing the fixing portions to the predetermined positions; and bending the outer leads, while the fixing portions are fixed to the rear surface of the stem, respectively so as to extend along the signal transmission pins on both sides of the signal transmission pins.

In accordance with this fabricating method of a high-frequency signal transmitting optical module, by an extremely simple method, the outer leads extending along the respective lead pins on both sides of the respective lead pins can be attached to the rear surface of the stem of the semiconductor optical device, whereby it becomes possible to form TEM wave transmission lines by the signal transmission pins, stem, and respective outer leads. That is, a high-frequency signal transmitting optical module which can realize a high-frequency signal transmission can be manufactured by use of the semiconductor optical device to which the highly versatile metal can package has been applied.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of a high-frequency signal transmitting optical module and a method of fabricating the same according to the present invention will be explained in detail with reference to FIGS. 1 to 11. In the explanation of the drawings, constituents identical to each other will be referred to with numerals identical to each other without repeating their overlapping descriptions.

Figure 1:
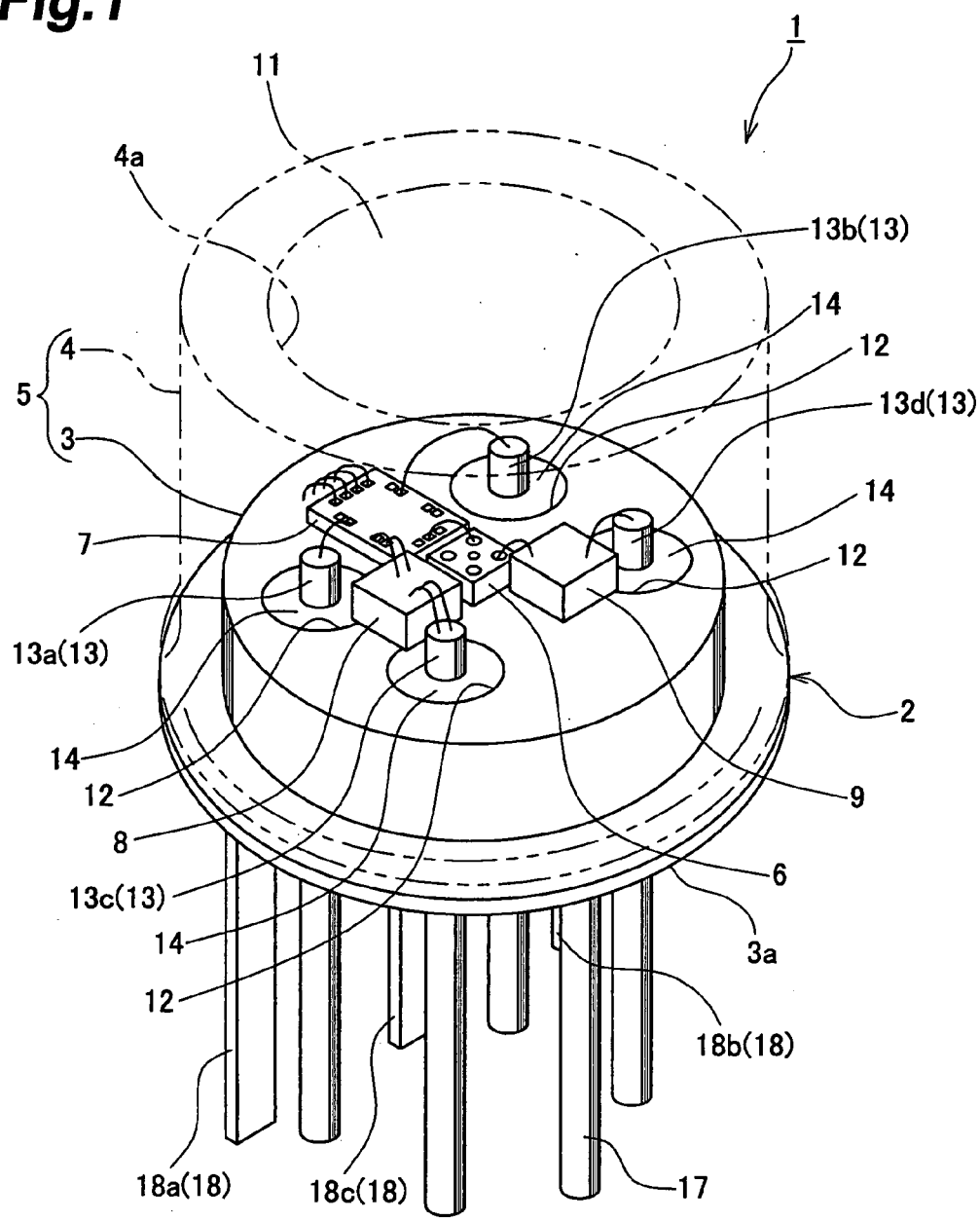
FIG. 1 is a perspective view showing one embodiment of a high-frequency signal transmitting optical module according to the present invention.

As shown in FIG. 1, a high-frequency signal transmitting optical module 1 has a semiconductor optical device 2. As this semiconductor optical device 2, in a TO-CAN type metal can package 5 composed of a stem 3 and a cap 4, a photodiode (semiconductor optical element) 6 capable of a high-speed operation, an amplifier 7 for converting a current signal of the photodiode 6 to a voltage signal, and capacitors 8 and 9 are housed. In the cap 4 of the metal can package 5, an opening 4a through which light to be received by the photodiode 6 passes is formed, and in this opening 4a, a glass plate 11 is fitted. Here, in the opening 4a, a lens is sometimes fitted in place of the glass plate 11.

Furthermore, in the stem 3 of the metal can package 5, four through holes 12 are formed, and in the respective through holes 12, lead pins 13 are disposed in a penetrating condition. Gaps between the inner wall surfaces of these through holes 12 and lead pins 13 are sealed by a glass sealing member 14. The respective lead pins 13 are, inside the metal can package 5, connected to the respective elements via wires. Concretely, the adjacent lead pins 13a and 13b are connected to a positive logic signal output pad and negative logic signal output pad of the amplifier 7, respectively. In addition, the lead pin 13c is connected to a power source pad of the amplifier 7 via the capacitor 8, and the lead pin 13d is connected to a cathode pad of the photodiode 6 via the capacitor 9.

Here, inside the metal can package 5, a GND pad of the amplifier 7 is connected to the stem 3 via wires. In addition, to a rear surface 3a of the stem 3, a ground pin 17 is connected by brazing.

Figure 2:
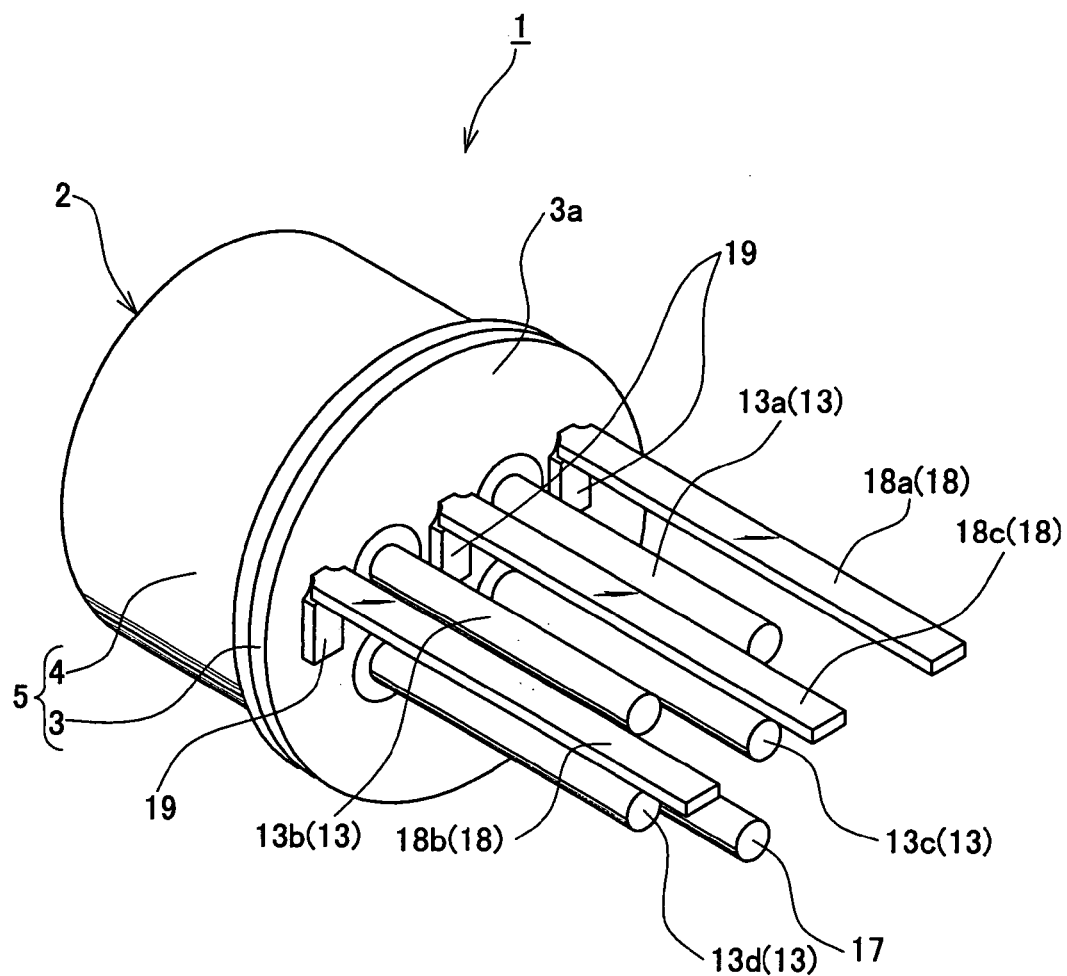
FIG. 2 is a perspective view when the high-frequency signal transmitting optical module shown in FIG. 1 is viewed from the lead pin side.

At the rear surface 3a of the stem 3 of the semiconductor optical device 2 constructed as in the above, as shown in FIG. 2, three plate-like outer leads 18 are attached. In greater detail, the respective outer leads 18 are, on a plane including the lead pins 13a and 13b, positioned outside the lead pin 13a, outside the lead pin 13b, and between the lead pin 13a and lead pin 13b and are extended approximately parallel to the lead pins 13a and 13b. For the respective outer leads 18, by bending stem 3-side end portions of the outer leads 18, fixing portions 19 fixed to the rear surface 3a of the stem 3 are provided.

In this embodiment, out of the three outer leads 18, outer leads 18a and 18c are extended along the lead pin 13a on both sides of the lead pin 13, which is a signal transmission pin. In addition, the outer leads 18b and 18c are extended along the lead pin 13b on both sides of the lead pin 13b, which is a signal transmission pin.

Here, since the ground pin 17 and outer leads 18 have the same potential as the stem 3, these all function as GND terminals. However, the ground pin 17 and outer leads 18 are different in that, while the ground pin 17 is attached at the time of material fabrication for the stem 3, the outer leads 18 are connected at nearly a last stage of fabrication for the high-frequency signal transmitting optical module 1.

In the high-frequency signal transmitting optical module 1 constructed as in the above, the outer leads 18 can be easily attached to the rear surface 3a of the stem 3 of the semiconductor optical device 2. This is made possible by, for example, fixing the fixing portions 19 to the rear surface 3a of the stem 3 by use of a solder, a conductive adhesive or the like in a condition where the outer leads 18 have been bent or by fixing the fixing portions 19 to the rear surface 3a of the stem 3 by laser welding or the like in a condition where the outer leads 18 have not yet been bent and then bending the outer leads 18. As such, since the outer leads 18 extending along the respective lead pins 13*a* and 13*b* on both sides of the respective lead pins 13*a* and 13*b*, which are signal transmission pins of the semiconductor optical device 2 are attached to the rear surface 3*a* of the stem 3, when the outer leads 18 are connected to ground potential, ground regions are continuously provided on both sides of the respective lead pins 13*a* and 13*b* by the stem 3 and respective outer leads 18. Thereby, since TEM wave transmission lines are formed by the respective lead pins 13*a* and 13*b*, stem 3, and respective outer leads 18, it becomes possible to output a high-frequency signal from the semiconductor optical device 2. By the above, according to this high-frequency signal transmitting optical module 1, a high-frequency signal transmission can be easily realized by use of the semiconductor optical device 2 to which the highly versatile metal can package 5 has been applied.

Next, as an example of a fabricating method for the high-frequency signal transmitting optical module 1, description will be given for a case where the fixing portions 19 of the respective outer leads 18 are fixed, by piercing welding (laser welding) by use of a YAG laser, to the rear surface 3*a* of the stem 3 of the semiconductor optical device 2.

Figure 3:
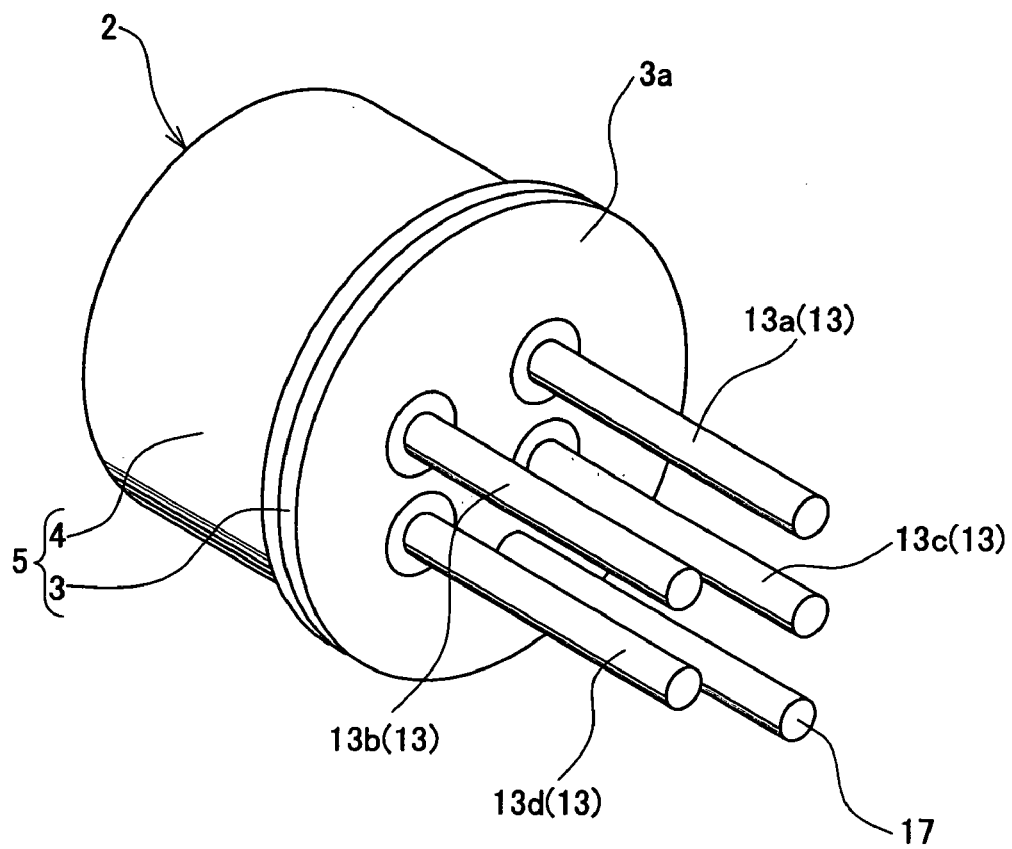
FIG. 3 is a perspective view when a semiconductor optical device is viewed from the lead pin side.
Figure 4:
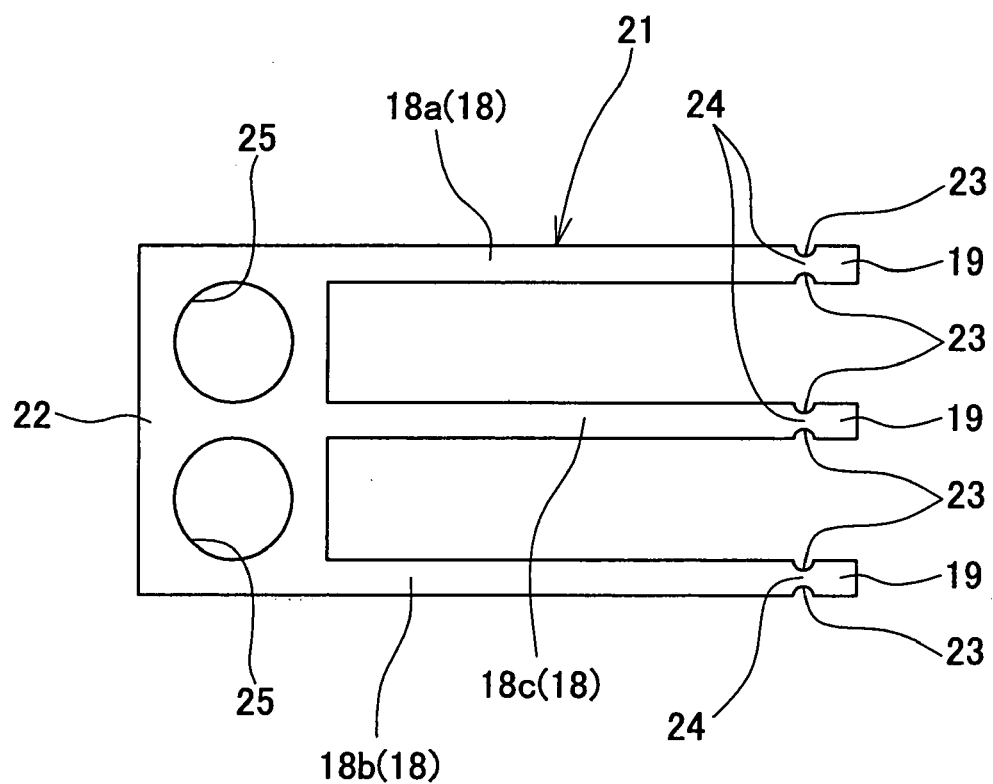
FIG. 4 is a plan view of a lead frame.

First, as shown in FIG. 3, the above-described semiconductor optical device 2 is prepared. In addition, as shown in FIG. 4, a plate-like lead frame 21 composed by juxtaposing the above-described outer leads 18*a*, 18*b*, and 18*c* is prepared. This lead frame 21 is, while the other-end portions of the respective outer leads 18, whose one-end portions are fixing portions 19, are connected by a rectangular connecting portion 22, integrally formed. In each outer lead 18, at a part to be bent when being attached to the rear surface 3*a* of the stem 3, by forming notch portions 23 on its both edge portions, a weakened portion 24 to make bending easy is formed (with respect to this weakened portion 24, a part on the one-end side becomes the fixing portion 19.) In addition, in the connecting portion 22, a pair of positioning holes 25 are formed. Here, the lead frame 21 is made of a metallic material such as kovar, and on its surface, a plating treatment such as gold plating or the like has been applied. In addition, the thickness of the lead frame 21 is provided as 0.2 mm so that piercing welding by means of a YAG laser can be easily and securely carried out.

Figure 5:
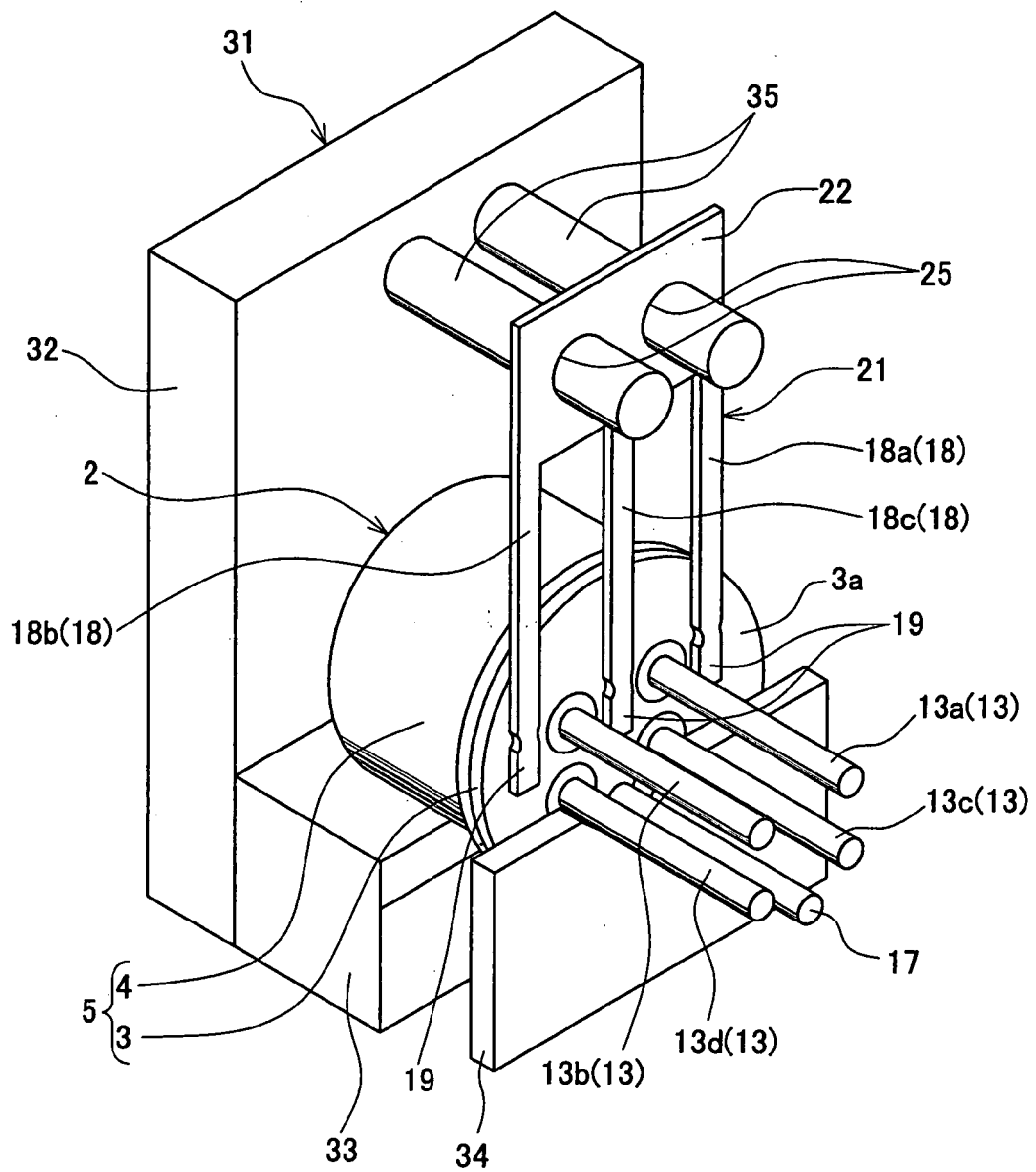
FIG. 5 is a perspective view showing a condition where the semiconductor optical device and lead frame have been attached to a fixing jig.

After the semiconductor optical device 2 and lead frame 21 are prepared, as shown in FIG. 5, these are attached to a fixing jig 31. Namely, on a placing base 33 provided at the front side of a back plate 32 of the fixing jig 31, the metal can package 5 of the semiconductor optical device 2 laid sideways is placed, and in V grooves of a supporting base 34 provided at the front side of the placing base 33, the lead pins 13*c* and 13*d* and ground pin 17 of the semiconductor optical device 2 are disposed. Subsequently, to a pair of positioning pins 35 provided in a standing condition on the front surface of the back plate 32, the positioning holes 25 of the lead frame 21 are fitted to bring the respective fixing portions 19 of the lead frame 21 into contact against the rear surface 3*a* of the stem 3 of the semiconductor optical device 2.

Figure 6:
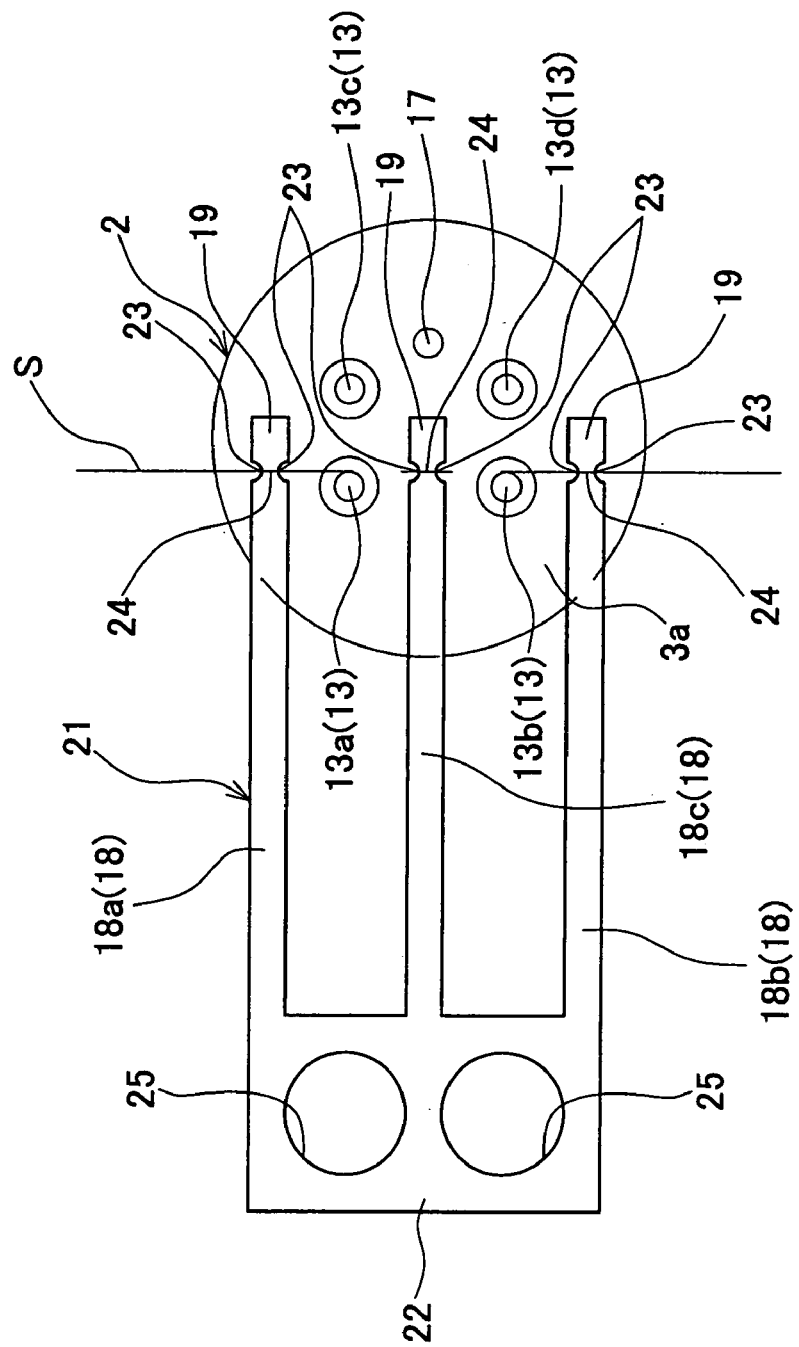
FIG. 6 is a view showing a positional relationship between the semiconductor optical device and lead frame.

In the fixing jig 31, a positional relationship of the placing base 33, supporting base 34, and positioning pins 35 among each other is set as follows. Namely, the relationship is set so that, when the semiconductor optical device 2 and lead frame 21 are attached to the fixing jig 31, as shown in FIG. 6, a straight line S connecting the centers of the weakened portions 24 of the respective outer leads 18 of the lead frame 21 (that is, a straight line S connecting central portions of the notch portions 23 of the respective outer leads 18) is made in contact with the ground pin 17-side surfaces of the respective lead pins 13*a* and 13*b*, which are signal transmission pins.

Figure 7:
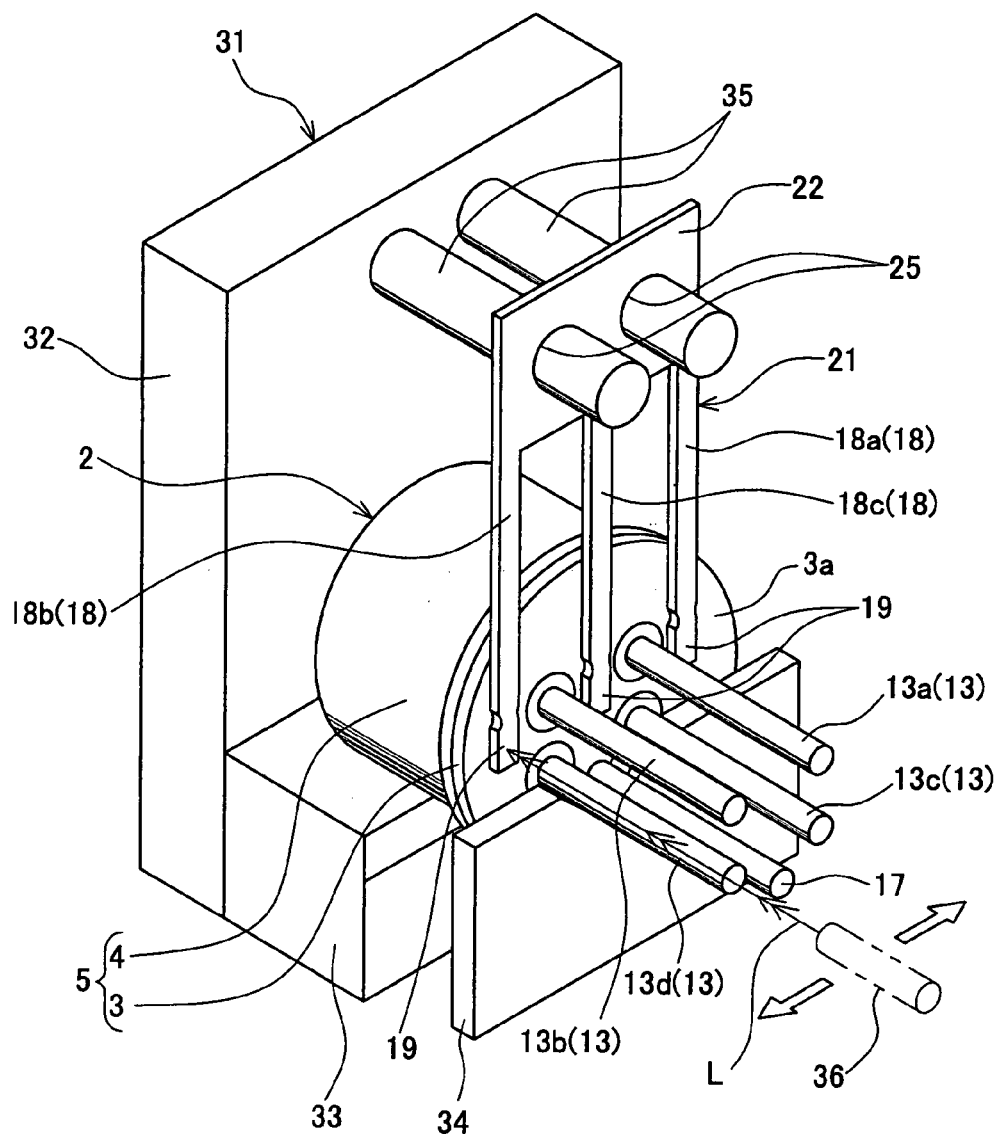
FIG. 7 is a perspective view showing a condition where the lead frame is being fixed to a stem of the semiconductor optical device by laser welding.

After attaching the semiconductor optical device 2 and lead frame 21 to the fixing jig 31, as shown in FIG. 7, by emitting a laser light L from a laser light emitting portion 36, which is shiftable in the horizontal direction, toward the respective fixing portions 19 in order, the respective fixing portions 19 are piercing-welded at predetermined positions of the rear surface 3*a* of the stem 3. At this time, since the respective outer leads 18 have a plate-like form, the fixing portions 19 of the respective outer leads 18 make surface contact with the rear surface 3*a* of the stem 3, whereby the outer leads 18 can be, in a stable condition, securely attached to the rear surface 3*a* of the stem 3. In addition, by thus applying piercing welding using a YAG laser to a fixation between the fixing portions 19 and stem 3, since heating of the fixing portions 19 and stem 3 can be made sufficient with local and short-time heating, harmful effects of heating exerted onto the respective elements in the semiconductor optical device 2 can be prevented.

Figure 8:
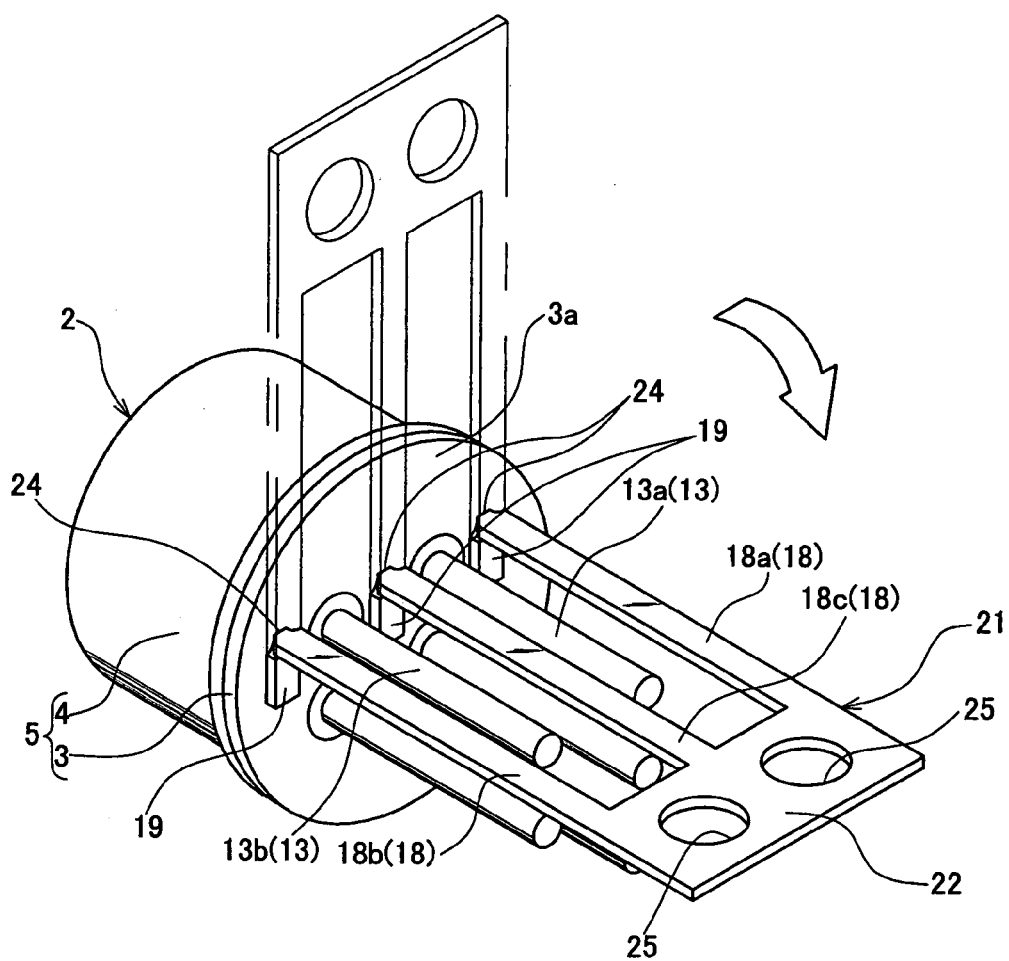
FIG. 8 is a perspective view showing a condition where the lead frame fixed to the stem of the semiconductor optical device is being bent.

Thereafter, the semiconductor optical device 2 and lead frame 21 are detached from the fixing jig 31, and, as shown in FIG. 8, the respective outer leads 18 of the lead frame 21 are simultaneously bent so as to extend along the respective lead pins 13*a* and 13*b* on both sides of the respective lead pins 13*a* and 13*b*, which are signal transmission pins. At this time, since the respective outer leads 18 have a plate-like form, and moreover, since the weakened portions 24 have been formed on the respective outer leads 18, bending of the respective outer leads 18 of the lead frame 21 can be easily and accurately carried out. In addition, when carrying out bending of the respective outer leads 18 of the lead frame 21 as such, since the fixing force by pierce welding using a YAG laser is strong, it is particularly effective to apply pierce welding to a fixation between the fixing portions 19 and stem 3.

Lastly, the connecting portion 22-side of the lead frame 21 is cut off by a cutter so that the respective outer leads 18 have a predetermined length, whereby a high-frequency signal transmitting optical module 1 is completed.

In accordance with the foregoing fabricating method for the high-frequency signal transmitting optical module 1, by an extremely simple method, the outer leads 18*a*, 18*b*, and 18*c* extending along the respective lead pins 13*a* and 13*b* on both sides of the respective lead pins 13*a* and 13*b*, which are signal transmission pins, can be attached to the rear surface 3*a* of the stem 3 of the semiconductor optical device 2, whereby it becomes possible to form TEM wave transmission lines by the respective lead pins 13*a* and 13*b*, stem 3, and respective outer leads 18. Accordingly, a high-frequency signal transmitting optical module 1 which can realize a high-frequency signal transmission can be manufactured by use of the semiconductor optical device 2 to which the highly versatile metal can package 5 has been applied.

Next, as a usage example of the high-frequency signal transmitting optical module 1, a circuit board mounted with a high-frequency signal transmitting optical module 1 will be described.

Figure 9:
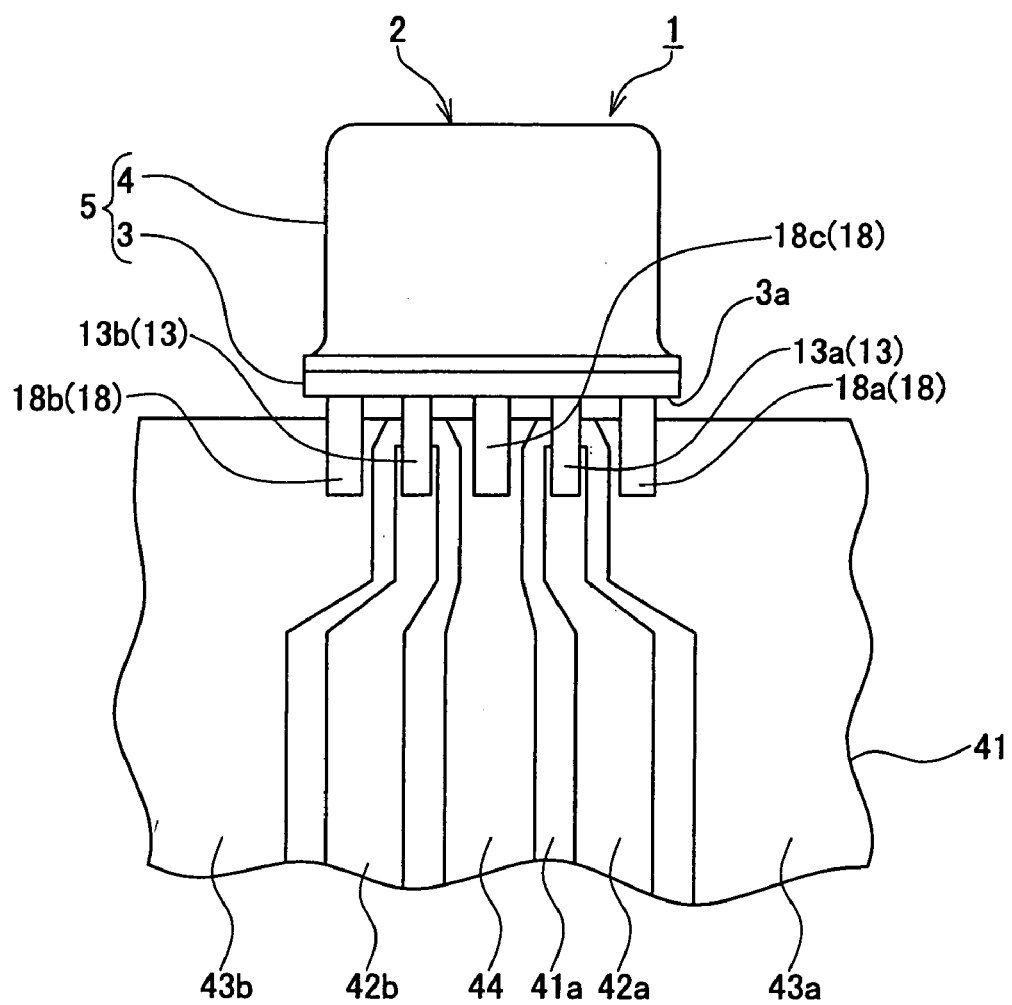
FIG. 9 is a front view showing a circuit board on which the high-frequency signal transmitting optical module shown in FIG. 1 has been mounted.
Figure 10:
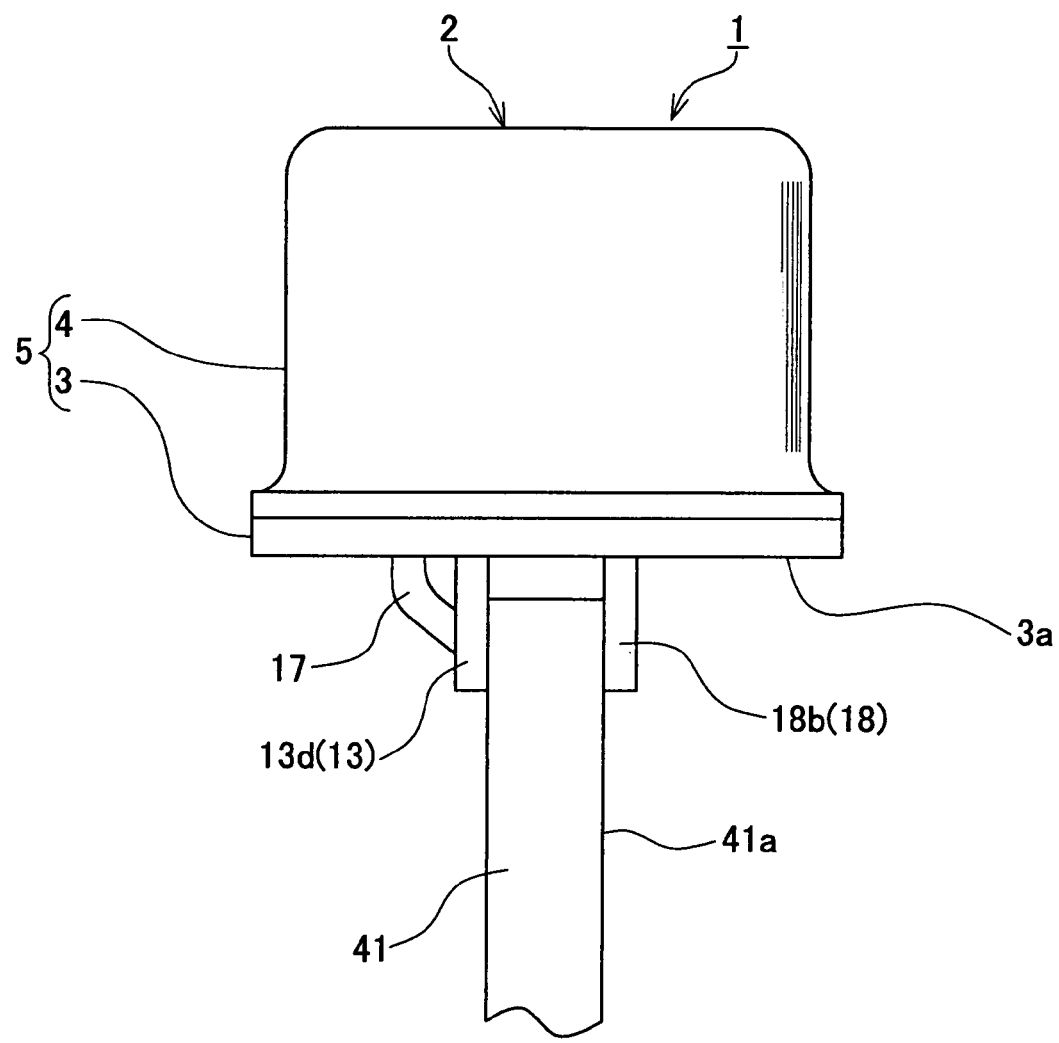
FIG. 10 is a left side view of the high-frequency signal transmitting optical module and circuit board shown in FIG. 9.
Figure 11:
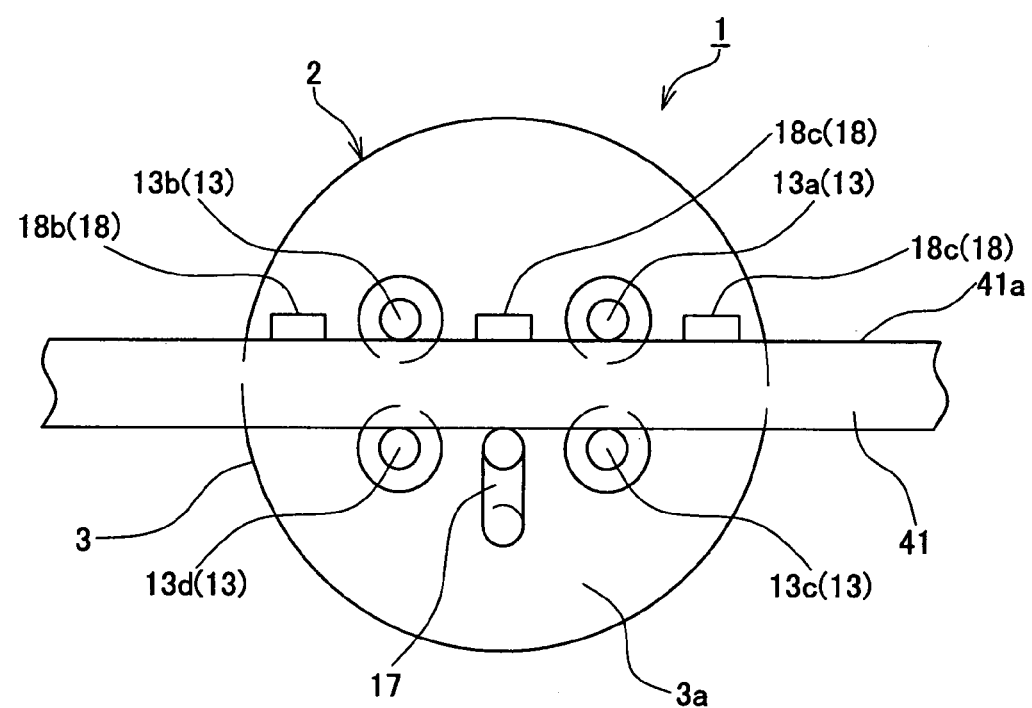
FIG. 11 is a bottom view of the high-frequency signal transmitting optical module and circuit board shown in FIG. 9.

As shown in FIG. 9 to FIG. 11, the high-frequency signal transmitting optical module 1 is attached to a circuit board 41 while the circuit board 41 is interposed between the lead pins 13*a* and 13*b* and lead pins 13*c* and 13*d*. On a lead pin 13*a*, 13*b*-side surface 41*a* of the circuit board 41, signal transmission wiring 42a with which a side surface of the lead pin 13a, which is a signal transmission pin, is made in contact and signal transmission wiring 42b to which a side surface of the lead pin 13b, which is a signal transmission pin, is made in contact are formed. The respective signal transmission lines 42a and 42b are extended toward a signal processing circuit mounted on the circuit board 41 and are connected to this signal processing circuit.

In the surface 41a of the circuit board 41, outside the signal transmission line 42, ground wiring 43a with which a side surface of the outer lead 18a of the high-frequency signal transmitting light module 1 is made in contact is formed. Similarly, outside the signal transmission wiring 42b, ground wiring 43b with which a side surface of the outer lead 18b is made in contact is formed. The respective ground wirings 42a and 42b are formed, with a predetermined distance from the respective transmission wirings 42a and 42b, along the respective signal transmission wirings 42a and 42b and are connected to ground potential.

Furthermore, in the surface 41a of the circuit board 41, between the signal transmission wiring 42a and signal transmission wiring 42b, ground wiring 44 with which a side surface of the outer lead 18c of the high-frequency signal transmitting optical module 1 is made in contact is formed. This ground wiring 44 is formed, with a predetermined distance from the respective signal transmission wirings 42a and 42b, along the respective signal transmission wirings 42a and 42b and is connected to ground potential.

Here, the respective wirings 42a, 42b, 43a, 43b, and 44 are produced by pattern formation by printing a conductive material such as copper on a base material of the circuit board 41. In addition, the respective lead pins 13a and 13b and respective signal transmission wires 42a and 42b are securely connected by a solder, a conductive adhesive or the like. Similarly, the respective outer leads 18a, 18b, and 18c and respective ground wirings 43a, 43b, and 44 are securely connected by a solder, a conductive adhesive or the like.

In the circuit board 41 constructed as in the above, a signal transmission line is formed by the lead pin 13a, which is a signal transmission pin of the high-frequency signal transmitting optical module 1, and signal transmission wiring 42a. On both sides of this signal transmission line, ground regions along the signal transmission line are continuously provided by the stem 3, respective outer leads 18a and 18c, and respective ground wirings 43a and 44. Such construction is similar to that of a signal transmission line formed by the lead pin 13b, which is a signal transmission pin of the high-frequency signal transmitting optical module 1, and signal transmission wiring 42b. Thereby, since TEM wave transmission lines are to be formed, it becomes possible to output high-frequency signals from the amplifier 7 provided inside the metal can package 5.

Here, even when a gap is formed between the rear surface 3a of the stem 3 of the high-frequency signal transmitting optical module 1 and edge portion of the circuit substrate 41, since TEM wave transmission lines are formed as described above, a high-frequency signal transmission is possible. However, in order to reduce impedance mismatching between the high-frequency signal transmitting optical module 1 side and circuit board 41 side, it is preferable to reduce the gap as much as possible between the rear surface 3a of the stem 3 and edge portion of the circuit board 41. In addition, disposing, in the gap, a dielectric material such as a silicon resin so as to cover the respective lead pins 13a and 13b and respective outer leads 18 also provides an effect to reduce the impedance mismatching.

The present invention is not limited to the above-described embodiment. For example, although the above-described embodiment has been for a case where the amplifier 7 housed in the metal can package 5 had two differential signal outputs, the amplifier 7 may have one signal output (namely, of a single end type). In this case, since the lead pin 13 to be a signal transmission pin is solely provided, it is sufficient that two outer leads 18 are provided so as to sandwich the lead pin 13.

The above-described embodiment has been for a case where the semiconductor optical device 2 had, as a semiconductor optical element, the photodiode 6 of a light receiving element and amplifier 7 connected to the photodiodes 6, however, as the semiconductor optical element of the semiconductor optical device 2, a sole photodiode, which is a photodetector, or a light emitter such as a laser diode may be provided. In a case of the light emitter, the lead pins 13 which are signal transmission pins function as signal input pins.

In addition, although the above-described embodiment has been for a case where the whole of the outer leads 18 had a plate-like form, as long as at least the fixing portions 19 of the outer leads 18 have a plate-like form, in such a case as, for example, the fixing portions 19 are fixed to the rear surface 3a of the stem 3 in a condition where the outer leads 18 have not yet been bent and then the outer leads 18 are bent, bending of the outer leads 18 can be easily carried out. Moreover, since the fixing portions 19 of the outer leads 18 are to be made in surface contact with the rear surface 3a of the stem 3, the outer leads 18 can be, in a stable condition, securely attached to the rear surface 3a of the stem 3.

Furthermore, in the above-described embodiment, as an example of the fabricating method of the high-frequency signal transmitting optical module 1, a description has been given for a case where the fixing portions 19 of the respective outer leads 18 were fixed by laser welding to the rear surface 3a of the stem 3 of the semiconductor optical device 2, the fixing portion 19 may be fixed to the rear surface 3a of the stem 3 by use of a solder, a conductive adhesive or the like.

In accordance with the present invention, a high-frequency signal transmission can be easily realized by use of the semiconductor optical device to which the highly versatile metal can package has been applied.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A high-frequency signal transmitting optical module, comprising:
  a semiconductor optical device having a semiconductor optical element; a metal can package accommodating said semiconductor optical element therein; and signal transmission pins protruding via through holes provided in a stem of said metal can package; and
  outer leads attached to a rear surface of said stem and extending along said signal transmission pins on both sides of said respective signal transmission pins,
  wherein, each of said outer leads has a fixing portion provided by bending an end portion of said each outer lead, said fixing portion being fixed to the rear surface of said stem, and wherein at the parts where the stem-side end portions of said each outer leads are bent, weakened portions to ease bending are formed, said weakened portions being arranged such that a straight line connecting the centers of said weakened portions of said respective outer leads is made in contact with the side surfaces of said signal transmission pins when the stem-side end portions of said respective outer leads are bent.

2. A high-frequency signal transmitting optical module according to claim 1, wherein said fixing portion is fixed to the rear surface of said stem by laser welding.

3. A high-frequency signal transmitting optical module according to claim 1, wherein at least the fixing portion of said each outer lead has a plate-like form.

4. A method of fabricating a high-frequency signal transmitting optical module according to claim 1, said method comprising the steps of:

preparing a semiconductor optical device which houses a semiconductor optical element in a metal can package and makes signal transmission pins protrude from through holes formed in a stem of said metal can package;

disposing, so that, of linear outer leads whose one-end portions are fixing portions, side surfaces of said fixing portions are brought into contact against predetermined positions of a rear surface of said stem, said outer leads on both sides of said signal transmission pins and fixing said fixing portions to the predetermined positions; and bending said outer leads, while said fixing portions are fixed to the rear surface of said stem, respectively so as to extend along said signal transmission pins on both sides of said respective signal transmission pins.

5. A high-frequency signal transmitting optical module according to claim 1, wherein each of said outer leads has a plate-like form.

6. A high-frequency signal transmitting optical module according to claim 1, wherein, after said outer leads are bent, TEM wave transmission lines are constituted by said signal transmission pins, said stem, and said outer leads bent.

7. A device comprising:

a high-frequency signal transmitting optical module according to claim 1;

a circuit board on which said high-frequency signal transmitting optical module is mounted; and a dielectric material provided so as to cover both said signal transmission pins and said outer leads.

8. A device according to claim 7, wherein said dielectric material includes a silicone resin.

* * * * *